United States Patent
Agrawal et al.

(10) Patent No.: US 7,350,170 B2
(45) Date of Patent: Mar. 25, 2008

(54) SYSTEM AND METHOD FOR MEMORY ELEMENT CHARACTERIZATION

(75) Inventors: Bhavna Agrawal, Ennetbaden (CH); Peter Feldmann, New York, NY (US); Sani R. Nassif, Austin, TX (US); Tomasz J. Nowicki, Briarcliff Manor, NY (US); Grzegorz Michal Swirszcz, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 1 day.

(21) Appl. No.: 11/142,709

(22) Filed: Jun. 1, 2005

(65) Prior Publication Data
US 2006/0277511 A1    Dec. 7, 2006

(51) Int. Cl.
*G06F 17/50* (2006.01)
(52) U.S. Cl. .............................. 716/6; 716/5
(58) Field of Classification Search ............... 716/4–6, 716/18, 2
See application file for complete search history.

(56) References Cited

U.S. PATENT DOCUMENTS

| | | | |
|---|---|---|---|
| 6,185,723 B1* | 2/2001 | Burks et al. .................... 716/6 |
| 6,378,109 B1* | 4/2002 | Young et al. .................... 716/4 |
| 6,711,509 B2* | 3/2004 | Bilas ............................ 702/61 |
| 6,868,534 B2* | 3/2005 | Fattouh et al. .................. 716/6 |
| 6,922,819 B2* | 7/2005 | Visweswariah ................. 716/2 |
| 6,975,978 B1* | 12/2005 | Ishida et al. ................... 703/15 |
| 2002/0143513 A1* | 10/2002 | Cohen et al. ................. 703/17 |
| 2005/0268265 A1* | 12/2005 | Ly et al. ........................ 716/6 |
| 2006/0031795 A1* | 2/2006 | Rahmat et al. ................. 716/5 |

* cited by examiner

*Primary Examiner*—Jack Chiang
*Assistant Examiner*—Binh Tat
(74) *Attorney, Agent, or Firm*—Keusey, Tutunjian & Bitetto, P.C.; Brian P. Verminski, Esq.

(57) ABSTRACT

A system and method for analyzing a memory element includes modeling the memory element using a simulation method and determining component response characteristics for components of the memory element. Safety regions are computed in a state space of the memory element, which indicate stable states. A transient analysis is performed to determine a path and time needed to reach one of the safety regions. Based on the path and time needed to reach one of the safety regions, a clock waveform or waveforms are determined which place a corresponding state in that safety region.

16 Claims, 7 Drawing Sheets

SYSTEM AND METHOD FOR MEMORY ELEMENT CHARACTERIZATION

BACKGROUND

1. Technical Field

The present invention relates to circuit design and more particularly to a system and method for memory element characterization in latch-type circuits.

2. Description of the Related Art

Latch-type circuits are employed in many electronic applications. The design of a latch circuit is an important aspect of the circuit's performance. The characterization of latch-type circuits is particularly tedious, however.

Latch characterization is typically based on circuit simulation experiments, mainly using transient analysis. In contrast to other characterization targets for library elements, e.g., propagation delay, there are no simulation experiments that can directly determine the set-up or hold-time of a latch.

Instead, a sequence of simulations with varying time delays between clock and data transition events are typically performed, essentially, in a search procedure for the situation when the settling time of the internal latch starts degrading. As a consequence, the characterization of the latch library elements becomes a very costly and disproportionately large portion of the total characterization effort.

SUMMARY

A system and method for analyzing a memory element includes modeling the memory element using a simulation method and determining component response characteristics for components of the memory element. Safety regions are computed in a state space of the memory element, which indicate stable states. A transient analysis is performed to determine a path and time needed to reach one of the safety regions. Based on the path and time needed to reach one of the safety regions, a clock waveform or waveforms are determined which place a corresponding state in that safety region.

A latch design system includes a modeling module configured to model a latch using a simulation method. A simulation module is configured to determine component response characteristics for components of the latch and compute safety regions in a state space of the latch. The safety regions indicate stable states for the latch. A transient analysis module is configured to determine transient responses for the latch in an open state to geometrically determine a path and time needed to reach one of the safety regions. The path and the time are employed to determine a clock waveform for placing a corresponding state in the one of the safety regions.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
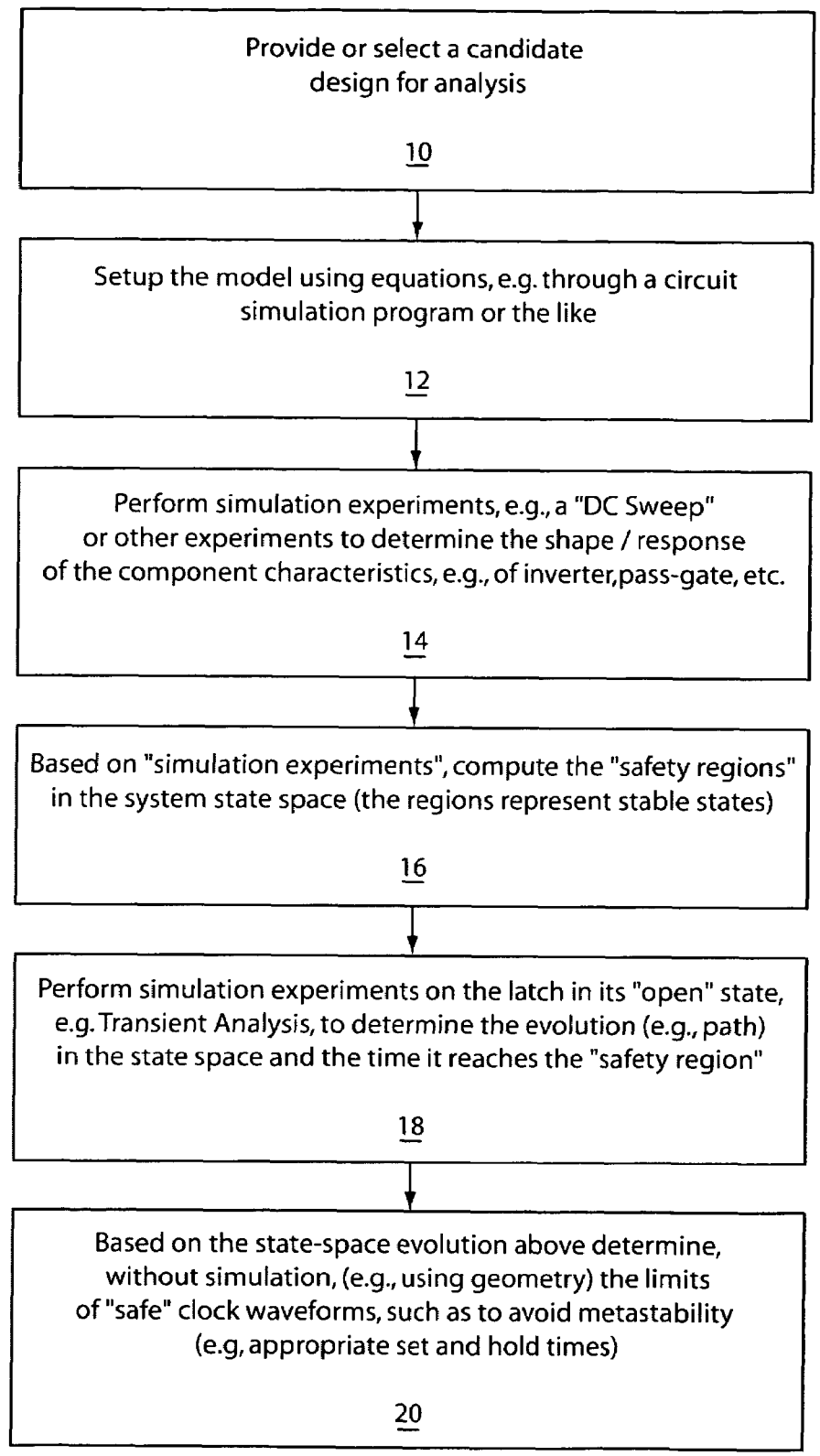
FIG. 1 is a block/flow diagram showing an illustrative system/method for avoiding metastable states by determining characteristics including set-up and hold times for a latch or memory circuit in accordance with one exemplary embodiment.

Embodiments of the present invention are directed to characterization of memory elements, such as latches. In a particularly useful embodiment, a latch design tool is provided, which may be implemented in software, and has the ability to characterize circuits, e.g., latches.

Library characterizations could benefit from a geometric, dynamical system-based approach in the following way. A geometric description of regions in state space together with relevant time constants can be derived off-line by a few simulation experiments. Once this description in constructed and stored, the response to numerous excitation patterns, e.g., signals with various slopes and relative delays between clock and data signals can be evaluated with little additional computation effort. For example, an area can be defined in the state space, such that every time an excitation "trajectory" passes through it, the set up or hold constraints are violated. This information is collected and employed in characterization of the simulated or actual circuit.

Embodiments of the present invention can take the form of an entirely hardware embodiment, an entirely software embodiment or an embodiment including both hardware and software elements. In a preferred embodiment, the present invention is implemented in software, which includes but is not limited to firmware, resident software, microcode, etc.

Furthermore, the present invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Circuits tested or simulated as described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed. The methods and tools as described herein may be employed in the fabrication of integrated circuit chips.

Referring now to the drawings in which like numerals represent the same or similar elements and initially to FIG. 1, a block/flow diagram is shown for an illustrative embodiment of the present invention. The method/system depicted in FIG. 1 may be employed as a design system/tool for designing memory elements, such as latches. One advantage of such as system includes the ability to pre-calculate characteristics to determine points of interest in a characteristic plot or state map. In this way, a simply lookup table may be used to apply the response to later conditions to achieve a rapid result without having to re-simulate the entire circuit. This is particularly useful with set and hold time computations for latches.

In block 10, a memory element candidate is selected or designed. A memory element may include a latch. A latch is an electrical element that includes two or more stable states and may be switched between to store information. The latch may include a metastable state between the stable states. This metastable region is preferably avoided.

In block 12, a model of the circuit or the memory element is provided. This may include an analytical model, e.g., equations, a software model, e.g., a SPICE™ model or the like, or any other simulation model that can simulate the operation and response of the memory elements being tested. For the present example, the model includes equations for the circuit depicted in FIG. 2. In a computer implemented embodiment, block 12 may represent a modeling module.

Figure 2:
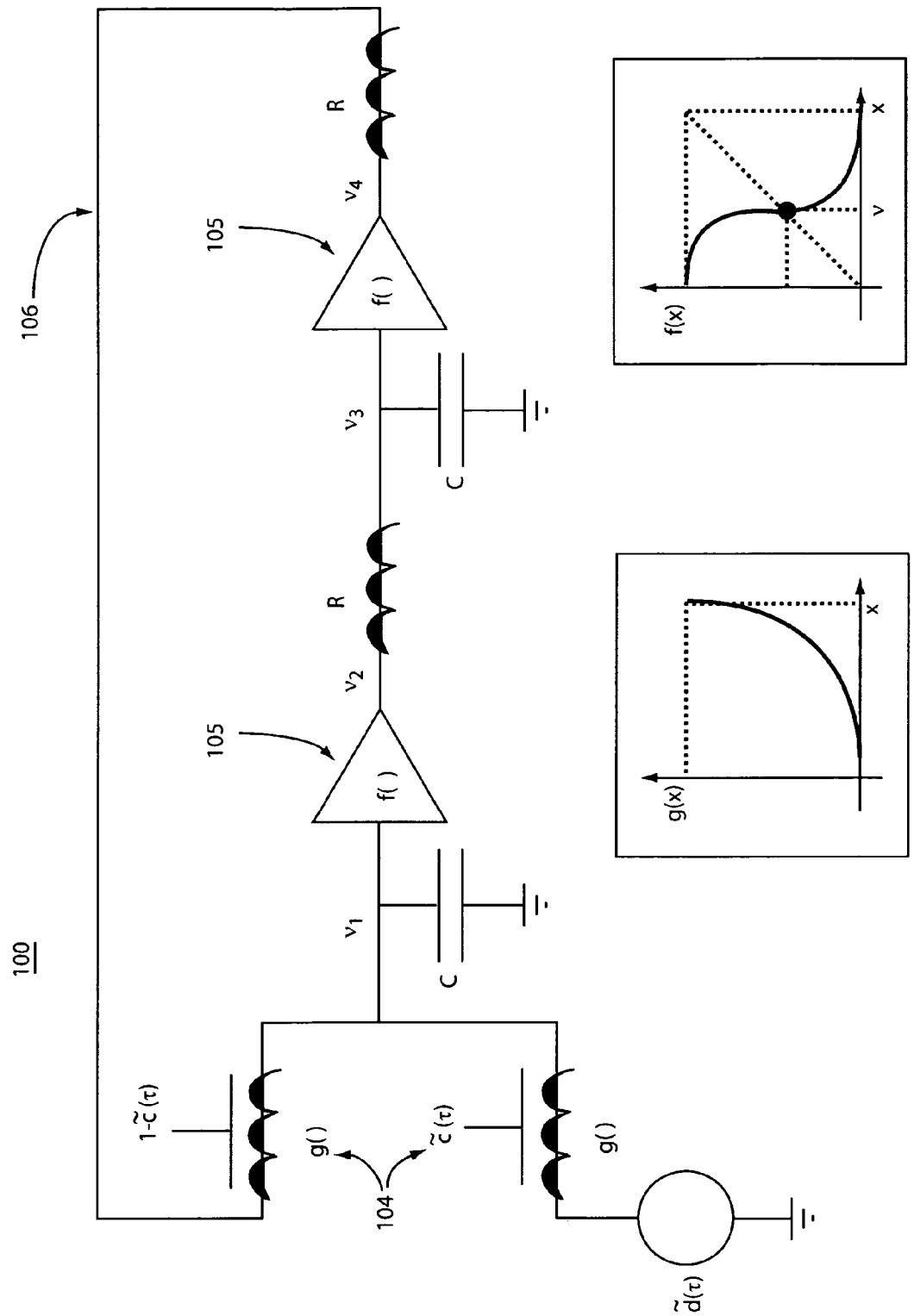
FIG. 2 is a schematic diagram of a latch circuit and response plots for given components on which an analysis is performed in accordance with an embodiment of the present invention.

In block 14, memory element pre-characterization is performed. This may take the form of simulation experiments. This may include performing, a "DC sweep" of operating points to determine a shape of the component characteristics. A static (vector-less) analysis of the latch circuits determines the boundaries of regions of interest in state-space. These boundaries may include parameters such as response voltages, currents or other electrical characteristics for the elements or components in the circuit to be analyzed. In the present example, circuit 100 of FIG. 2 includes elements such as a pass gate 104 and inverters 105 which are analyzed. FIG. 2 depicts a function g(x) for pass gate 104 and a function f(x) for inverters 105, which define regions/points of interest for these components. These points of interest may be stored as tables and/or functional constraints.

In block 16, based upon the simulation experiments in block 14, safety regions are computed. Safety regions in this example are depicted as rectangular shaped regions 120 and 122 in FIG. 8. While depicted as rectangles, safety regions 120 and 122 may take on many shapes and sizes, or may be adjusted to permit different analysis or test scenarios in the design of circuit 100 (FIG. 2). There may be one or more safety regions in the system state space depending on the number of stable states for the circuit.

Safety regions are regions of stability. Each safety region represents a state where the value of the data to be stored in the memory element or latch is invariant.

In block 18, simulation experiments are performed on the memory element (e.g., latch 106) in its "open" state. The open state is where data is being latched into the memory element. The open state simulation includes a transient analysis of the latch to determine the evolution of the state space and the time needed to reach the safety region. In other words, the time and path needed to reach an invariant or stable state.

For example, excitation of data $\tilde{d}(\tau)$ and clock $\tilde{c}(\tau)$ waveforms determine a trajectory in the state space. The trajectory is checked against the stored geometry of the safety region to determine if it traverses the safety region. The path (evolution) and time is stored. This analysis can be performed more efficiently (by orders of magnitude) over conventional circuit simulation techniques.

In block 20, set-up and hold time extraction is performed. Based on the state-space evolution determined in block 18, without the simulation limits of clock waveforms corresponding to the safety regions, clock waveforms are determined which avoid metastability of the latch. This is preferably performed using a geometric layout of the system space either on paper or in digital space.

The set-up and hold times can be obtained by performing this simplified geometric analysis rather than time consuming conventional circuit simulation. This may preferably include employing look-up tables to determine safety regions and whether a given set of conditions falls within the safety regions.

Alternatively, the geometric analysis may become sufficiently efficient to be used in timing analysis, thus replacing set up and hold constraints simulations.

In a system, which may be implemented by computer, blocks 14, 16, 18 and 20 may be implemented together in a single module or independently in a plurality of different modules. For example, blocks 14 and 16 may be a part of a simulation module to obtain simulated results of the latch, while a transient analysis module may be embodied by blocks 18 and 20. Other combinations of functions are also contemplated.

The present invention will now be described in further detail in terms of an illustrative example using latch 106.

Referring to FIG. 2, the exemplary circuit 100 upon which the present invention is illustratively described is shown. Circuit 100 includes a data source $\tilde{d}(\tau)$ and a clock $\tilde{c}(\tau)$. Clock $\tilde{c}(\tau)$ is introduced to a passgate 104 having a transition response given by g( ). Latch element 106 includes capacitors C, inverters 105 and resistances R. $v_1$, $v_2$, $v_3$, and $v_4$ indicate the state or electrical characteristic of the respective locations in the circuit 100. Note that the numbered states $v_1$, $v_2$, $v_3$, and $v_4$ are not the same as the parameter, v, which will be described hereinafter.

The pass gate 104 acts as a switch to activate/deactivate the latch 106 to change latch states or maintain the latch state during a hold period. Since the switch 104 provides a gradual response (g(x)) between states (e.g., "0" and "1") and inverters 105 provide a gradual response (f(x)) between states, metastable possibilities exist for the latch states.

In an ideal situation, switching between states is instantaneous (for both the passgate 104 and the inverters 105). Ideally, function g( ) and f( ) would be steps functions having plateaus at each state. This is not the case in real applications however, as seen by the response curves for g(x) and f(x). Let v be a value, which indicates a point where an ideal instantaneous switching of states should occur. That is, when x=v, the step function switches between values. This point of interest may be applied to the f(x) curve as a point of interest.

Figure 3:
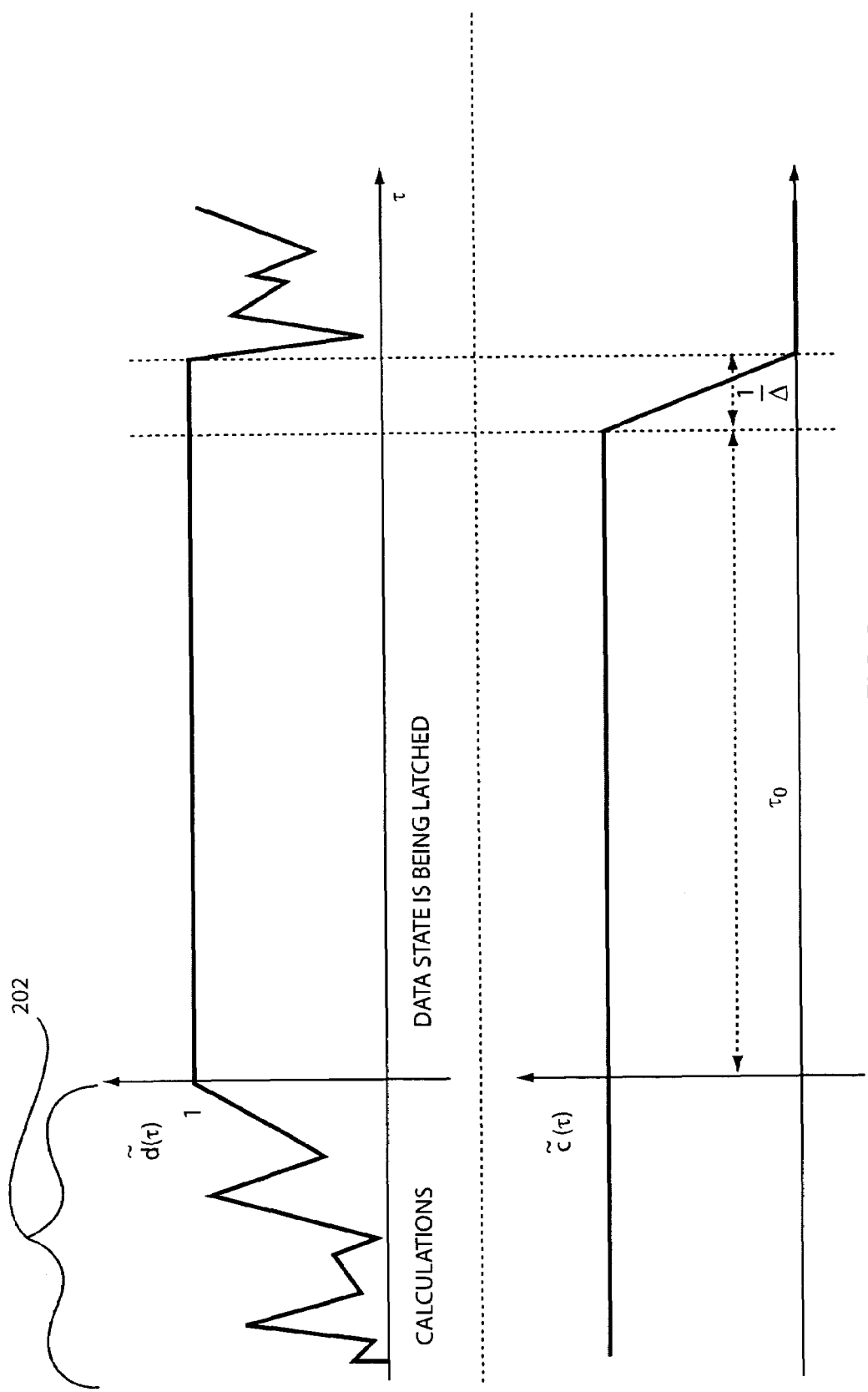
FIG. 3 is a timing diagram of the latch circuit of FIG. 2 showing data and clock signals for an open state for latching data in the latch in accordance with an embodiment of the present invention.

Referring to FIG. 3, an illustrative timing diagram is depicted showing data $\tilde{d}(\tau)$ and clock $\tilde{c}(\tau)$ signals over time for an open clock state. In region 202, $\tilde{d}(\tau)$ varies (e.g., during calculations or other operations), then at $\tau=0$ a logical "1" is to be written to the latch (106). During this period $\tilde{c}(\tau)$ remains high for a period of time. $\tilde{d}(\tau)$ and $\tilde{c}(\tau)$ remain high to enable the "1" to be stored or latched in the memory element (latch 106) during period $\tau_0$. When $\tilde{c}(\tau)$ transitions low at $\tau_0$ after a period of $1/\Delta$, the latch enters its hold state to maintain the set value of the data. The clock $\tilde{c}(\tau)$ transitions between low and high or open clock and closed clock states. The open state is given by $\tau \leq 0$ and the closed state is given by $\tau \geq \tau_0 + 1/\Delta$.

Figure 4:
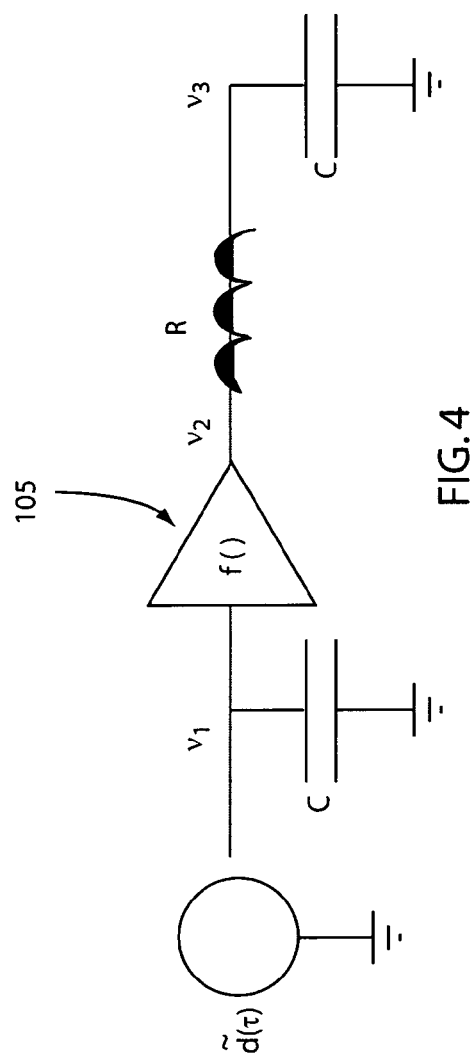
FIG. 4 is a schematic diagram of the latch circuit of FIG. 2 showing the open state.
Figure 5:
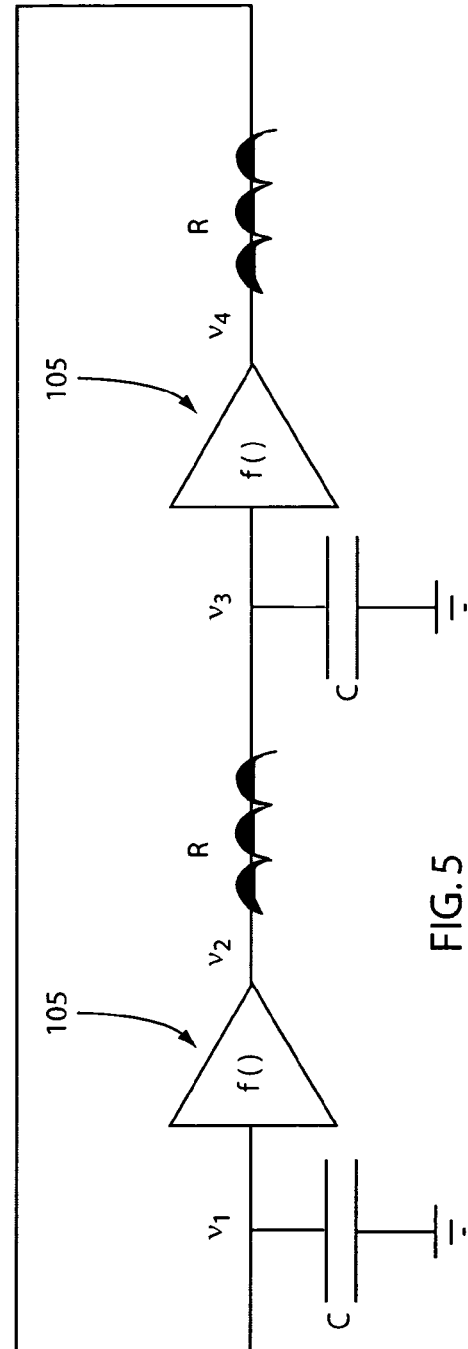
FIG. 5 is a schematic diagram of the latch circuit of FIG. 2 showing a closed state.

FIGS. 4 and 5, respectively show equivalent circuits during the open state (FIG. 4) when data is latched and the closed state where data is maintained in the latch.

From the latch circuit in FIG. 2, Kirchoff's laws are applied to the circuit to yield:

$$f(v_1) - v_2 = 0 \quad (1)$$

$$Cv_3' - (1/R)v_2 + (1/R)v_3 = 0 \quad (2)$$

$$f(v_3) - v_4 = 0 \quad (3)$$

$$Cv_1' + \left(\frac{Rg(\overline{c}(\tau))}{1 + Rg(\overline{c}(\tau))} + g(c(\tau))\right)v_1 - \frac{g(\overline{c}(\tau))}{1 + Rg(\overline{c}(\tau))}v_4 = g(c(\tau))d(\tau) \quad (4)$$

the following are denoted:

$$g(\tau) = g(c(\tau)); \overline{g}(\tau) = \overline{g}(\overline{c}(\tau)); r = \frac{1}{R};$$

and we eliminate $v_2$ and $v_4$ to get:

$$Cv_1' = \left(\frac{r\overline{g}(\tau)}{r + \overline{g}(\tau)} + g(\tau)\right)v_1 + \frac{r\overline{g}(\tau)}{r + \overline{g}(\tau)}f(v_3) + g(\tau)d(\tau) \quad (5)$$

$$Cv_3' = -rv_3 + rf(v_1). \quad (6)$$

Variables are redefined as follows:

$u = v_1$; $v = v_3$; $Ct = \tau$; $\delta = C\Delta$ and the following functions are introduced:

$$p(t) = \frac{r\overline{g}(\tau(t))}{1 + r\overline{g}(\tau(t))}; \; q(t) = g(\tau(t)); \; d(t) = \tilde{d}(\tau(t))$$

Making the appropriate substitutions of the introduced functions p and q, the derivatives of du/dt and dv/dt ($\dot{u}$ and $\dot{v}$, respectively) are as follows:

$$\dot{u} = -(p(t) + q(t))u + p(t)f(v) + q(t)d(t) \quad (7)$$

$$\dot{v} = -rv + rf(u) \quad (8)$$

This system of ordinary differential equations cannot be solved in closed form, but can be solved using the qualitative theory of ordinary differential equations.

Using known conditions, the differential equations can be solved. For example, as shown when the clock is closed (c(t)=0), equations 7 and 8 can be plotted (u versus v as depicted in plot 223 for the circuit diagram 222 in FIG. 6.

Figure 6:
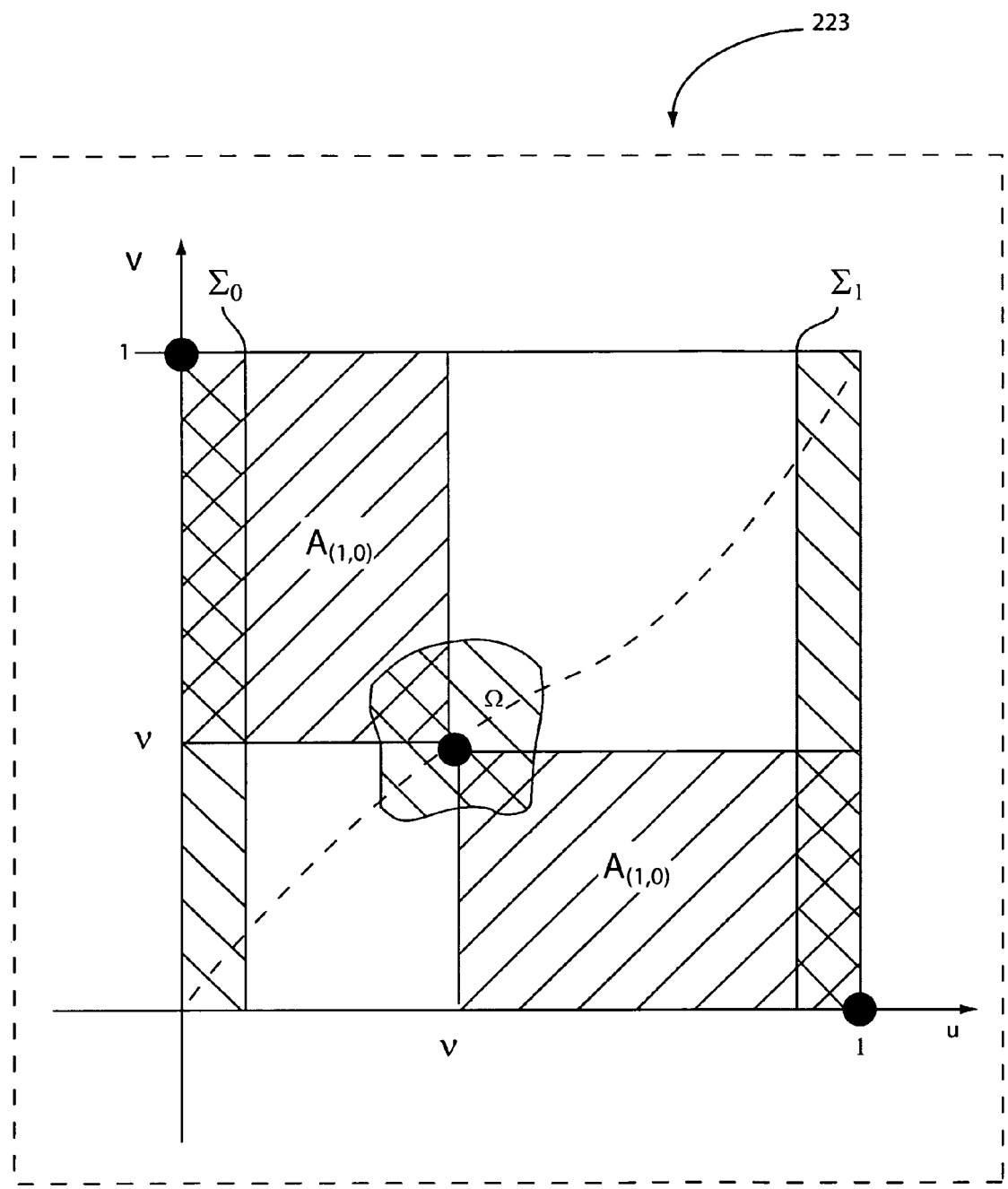
FIG. 6 is a plot of the states in the closed latch state.

Referring to FIG. 6, the dynamic determination of the circuit response during the closed state is shown in plot 223 for equivalent circuit for the closed state shown in FIG. 5. Regions $A_{(0,1)}$ and $A_{(1,0)}$ depict theoretical states which can be occupied during the hold period. $\Sigma_0$ is the safety zone for state 0 and $\Sigma_1$ is the safety zone for state "1". Region $\Omega$ shows an area of potential metastability around inflexion point (v,v) where v is the ideal state switching boundary. Metastability is a state where the time to reach one of the two stable states cannot be bounded, e.g., the settling time may be too long.

When clock is open (c(t)=1) and equations 7 and 8 become:

$$\dot{u} = -u + d(t)$$

$$\dot{v} = -rv + rf(u)$$

This system can be solved explicitly.

Applying a value of 1 to the latch (d(t)=1) yields:

$$\dot{u} = -u + 1$$

$$\dot{v} = -rv + rf(u)$$

It may also be assumed that the start time is t=0. So, for initial conditions $(u,v) = (u_0, v_0)$:

$$u(t) = (u_0 - 1)e^{-t} + 1,$$

$$v(t) = e^{-rt}\left(v_0 + \int_0^{rt} e^s f(u(Rs))ds\right).$$

u(t) is a monotonous function of $u_0$, so we get:

$$u(t) \geq 1 - e^{-1}.$$

Figure 7:
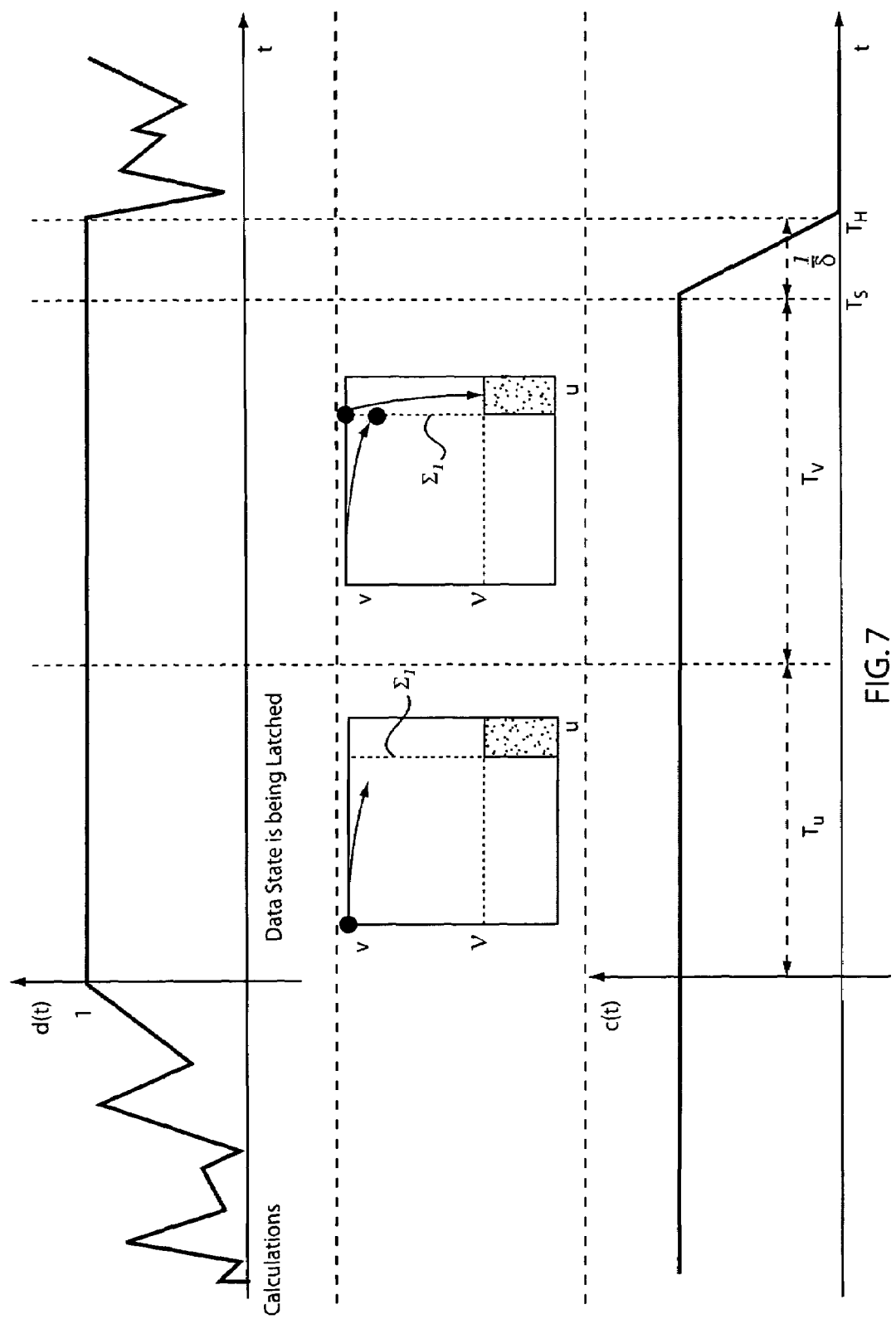
FIG. 7 is a timing diagram of the latch circuit of FIG. 2 showing data and clock signals and parameters associated with the signals, as well and plots showing the path taken and the time needed to reach a safety region in accordance with an embodiment of the present invention.

Referring to FIG. 7, the time needed to latch data, To (see FIG. 2), needs to be achieved. The time $T_u$ needed for u(t) to reach $\Sigma_1$ satisfies:

$$T_u \le \ln\frac{1}{\varepsilon} \qquad (9)$$

where $\varepsilon$ is a parameter used to define the safety regions for the open state or clock analysis.

However, the amount of time needed to latch, e.g., a "1" needs to be $T_u$ plus $T_v$ since $\tau_0 = T_u + T_v$, where To is equal to the set-up time for the latch. While the value of u needs to reach $\Sigma_1$, the value of v needs to reach v as shown in FIG. 7. Therefore, for $u > 1-\varepsilon$ to be preserved when the latch is closing, $v < f^{-1}(1-\varepsilon)$. The time $T_v$ can be calculated by:

$$f^{-1}(1-\varepsilon) = e^{-rT_v}\left(v(T_u) + \int_0^{rT_v} e^s f(1 - \varepsilon e^{-Rs}) ds\right). \qquad (10)$$

S is an integration parameter. The right hand side of the equality is an increasing function of $v(T_u)$, the function f is decreasing, so $$f^{-1}(1-\varepsilon) \le e^{-rT_v} + \int_0^{rT_v} 1 + e^s f(1-\varepsilon) ds). \qquad (11)$$

This reduces to:

$$T_v \le R\ln\left(\frac{1 - f(1-\varepsilon)}{f^{-1}(1-\varepsilon) - f(1-\varepsilon)}\right). \qquad (12)$$

Equation 12 may be approximated by $T_v \approx R(\ln(1/v))$. Therefore, the time needed to latch data into the latch can be determined. FIG. 7 illustratively shows a set-up time ($T_S$) and a hold time ($T_H$) for the latch, with the difference between these times being $1/\delta$.

Referring again to FIG. 8, an estimate of the characteristics of the latch 104 is illustratively shown. Paths 230 and 232 show the time-dependent change going between states.

Figure 8:
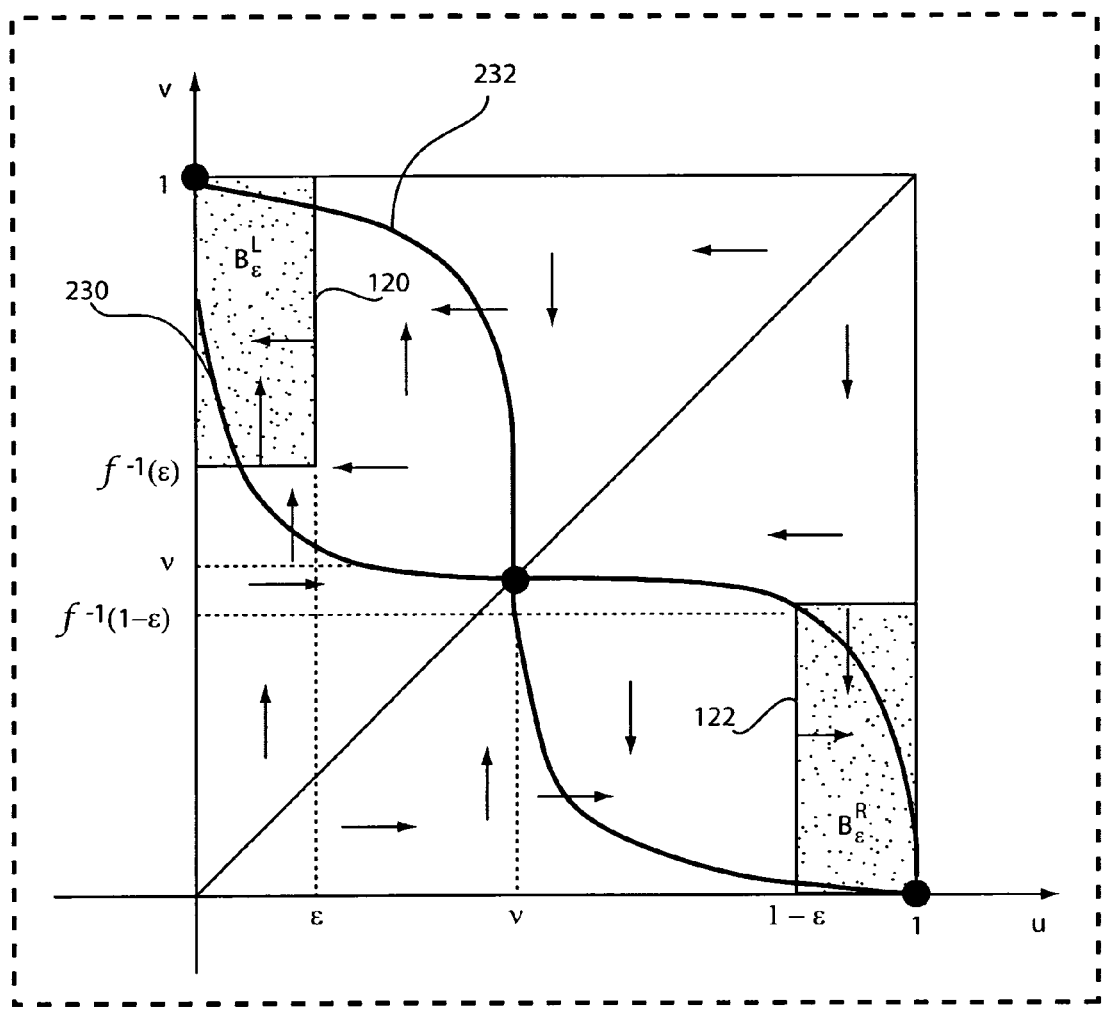
FIG. 8 is diagram showing a state space for the open state of the latch of FIG. 2, and showing safety regions within the state space in accordance with an embodiment of the present invention.

FIG. 8 shows safety regions 120 and 122 labeled with $B^L_\varepsilon$ and $B^R_{68}$ respectively. The safety regions are determined in accordance with the following. If a parameter $\varepsilon < v$ and $d(t) < \varepsilon$ then the set $B^L_\varepsilon$ is an invariant set of the system provided by equations 7 and 8. If $d(t) > 1-\varepsilon$, then the set $B^R_\varepsilon$ is an invariant set of equations 7 and 8. When q=0 then both sets $B^L_\varepsilon$ and $B^R_\varepsilon$ are invariant.

It can be seen from FIG. 8 that the bounding values of $B^L_\varepsilon$ include $\varepsilon$ and $f^{-1}(\varepsilon)$ and the bounding values for $B^R_\varepsilon$ include $1-\varepsilon$ and $f^{-1}(1-\varepsilon)$. FIG. 8 provides the characteristic curves against which set and hold times for the latch can easily be computed. The set-up time $\tau_S$ and hold time $\tau_H$ satisfy the following equations:

$$\tau_S \le C\ln\frac{1}{\varepsilon} + RC\ln\left(\frac{1-f(1-\varepsilon)}{f^{-1}(1-\varepsilon) - f(1-\varepsilon)}\right) \qquad (13)$$

-continued $$\tau_H = \tau_S + \frac{1}{\Delta} \approx C\ln\frac{1}{\varepsilon} + RC\ln\frac{1}{v} + \frac{1}{\Delta}. \qquad (14)$$

By determining the characteristic curves as provided above, the speed and accuracy of determining characteristics of circuits, e.g., memory circuits, such as latches in significantly increased. The set and hold times illustratively determined above is easily performed by calculation instead of a time consuming simulation which requires computer processing time and overhead.

Other advantages are provided by present invention. For example, balancing or tradeoff studies between parameters or characteristics may easily be performed. In one example, a tradeoff study can be performed between data bus and memory accessibility. Data from a data bus going to/from a latch may be accessible earlier at the cost of wait time to retrieve the latched data. The balance can be struck by increasing the size of the safety zone greater than $B^R_\varepsilon$ in the design.

Having described preferred embodiments of a system and method for memory element characterization (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for analyzing a memory element comprising the steps of:
    modeling the memory element using a simulation method;
    determining component response characteristics for components of the memory element;
    computing safety regions in a state space of the memory element, the safety regions indicating stable states for the memory element;
    performing a transient analysis to determine a path and time needed to reach one of the safety regions; and
    determining a clock waveform based on the path and the time needed to reach one of the safety regions, the clock waveform being configured to place a corresponding state in the one of the safety regions to be employed in adapting a memory element for stable operations.

2. The method as recited in claim 1, wherein the step of determining a clock waveform includes determining a set-up time for the memory element by employing the bounds determined for the safety region.

3. The method as recited in claim 2, wherein the step of determining a clock waveform includes determining a start hold time for the memory element by employing the bounds determined for the safety region and the set-up time.

4. The method as recited in claim 1, wherein the step of modeling the memory element using a simulation method includes modeling the memory element using equations.

5. The method as recited in claim 1, wherein the step of modeling the memory element using a simulation method includes modeling the memory element using simulation software.

6. The method as recited in claim 1, wherein the path and the time needed to reach one of the safety regions is determined based on a geometric layout of the state space.

7. The method as recited in claim 1, wherein the step of performing a transient analysis includes performing an open state transient analysis.

8. The method as recited in claim 1, wherein the step of computing safety regions includes computing safety regions based on simulation experiments performed on the memory element.

9. A computer useable medium including a computer readable program, wherein the computer readable program when executed on a computer causes the computer to perform the steps of:

modeling the memory element using a simulation method;

determining component response characteristics for components of the memory element;

computing safety regions in a state space of the memory element, which indicate stable states for the memory element; and performing a transient analysis to determine a path and an amount of time needed to reach one of the safety regions; and based on the path and amount of time needed to reach one of the safety regions, determining a clock waveform which places a corresponding state in that safety region to be employed in adapting a memory element for stable operations.

10. The computer program product as recited in claim 9, wherein the step of determining a clock waveform includes determining a set-up time for the memory element by employing the bounds determined for the safety region.

11. The computer program product as recited in claim 10, wherein the step of determining a clock waveform includes determining a start hold time for the memory element by employing the bounds determined for the safety region and the set-up time.

12. The computer program product as recited in claim 9, wherein the step of modeling the memory element using a simulation method includes modeling the memory element using equations.

13. The computer program product as recited in claim 9, wherein the step of modeling the memory element using a simulation method includes modeling the memory element using a simulation software program.

14. The computer program product as recited in claim 9, wherein the path and the amount of time needed to reach one of the safety regions is determined based on a geometric layout of the state space.

15. The computer program product as recited in claim 9, wherein the step of performing a transient analysis includes performing an open state transient analysis.

16. The computer program product as recited in claim 9, wherein the step of computing safety regions includes computing safety regions based on simulation experiments performed on the memory element.

\* \* \* \* \*